United States Patent [19]

Wu

[11] Patent Number: 5,998,277
[45] Date of Patent: Dec. 7, 1999

[54] METHOD TO FORM GLOBAL PLANARIZED SHALLOW TRENCH ISOLATION

[75] Inventor: Shye-Lin Wu, Hsinchu, Taiwan

[73] Assignee: Texas Instruments - Acer Incorporated, Hsinchu, Taiwan

[21] Appl. No.: 09/042,349

[22] Filed: Mar. 13, 1998

[51] Int. Cl.$^6$ .................................................. H01L 21/76
[52] U.S. Cl. .......................... 438/407; 438/423; 438/440; 438/766
[58] Field of Search ............................ 438/370, 404–407, 438/423, 439, 440, 480, 506, 514, 522, 765, 766, FOR 442, FOR 444

[56] References Cited

U.S. PATENT DOCUMENTS

| | | | |
|---|---|---|---|
| 4,045,249 | 8/1977 | Hotta | 438/440 |
| 4,098,618 | 7/1978 | Crowder et al. | 438/440 |
| 4,746,630 | 5/1988 | Hui et al. | 438/439 |
| 4,748,134 | 5/1988 | Holland et al. | 438/440 |
| 4,929,566 | 5/1990 | Beitman | 438/423 |
| 4,968,636 | 11/1990 | Sugawara | 438/423 |
| 4,968,641 | 11/1990 | Kalnitsky et al. | 438/439 |
| 5,436,175 | 7/1995 | Nakato et al. | 438/766 |
| 5,494,846 | 2/1996 | Yamazaki | 438/423 |
| 5,661,044 | 8/1997 | Holland et al. | 438/766 |
| 5,741,717 | 4/1998 | Nakai et al. | 438/766 |
| 5,814,551 | 9/1998 | Park et al. | 438/439 |

*Primary Examiner*—Olik Chaudhuri
*Assistant Examiner*—Anh Duy Mai
*Attorney, Agent, or Firm*—Harness, Dickey & Pierce, P.L.C.

[57] ABSTRACT

The method of the present invention is a method of including forming an oxide layer on the substrate. A nitride layer is subsequently formed on the oxide layer. A photoresist layer is formed on the nitride layer to define isolation regions that uncovered by the photoresist layer. A liquid phase deposition oxide is deposited on the isolation regions. Then the photoresist layer is removed. After removing the photoresist layer, an oxygen ion implantation is performed through the oxide layer and the nitride layer into the substrate by using the liquid phase deposition oxide layer as implant mask to form relative high oxygen ion contained regions in the substrate. After the ion implantation is done, the liquid phase deposition oxide layer is removed. An annealing process is carried out to form isolation regions in the substrate and recover implant-induced damage.

10 Claims, 3 Drawing Sheets

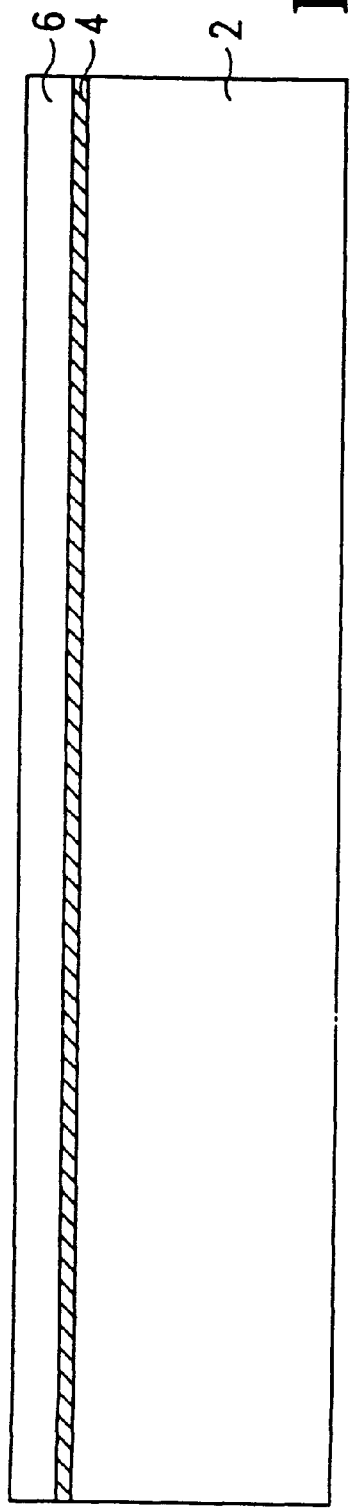
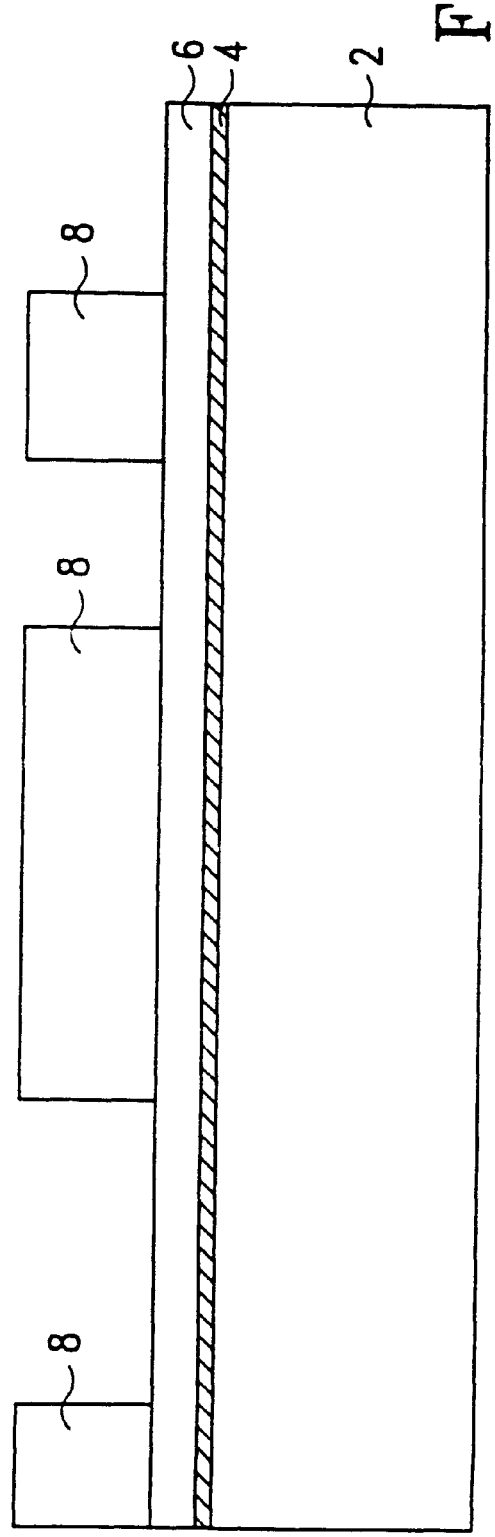

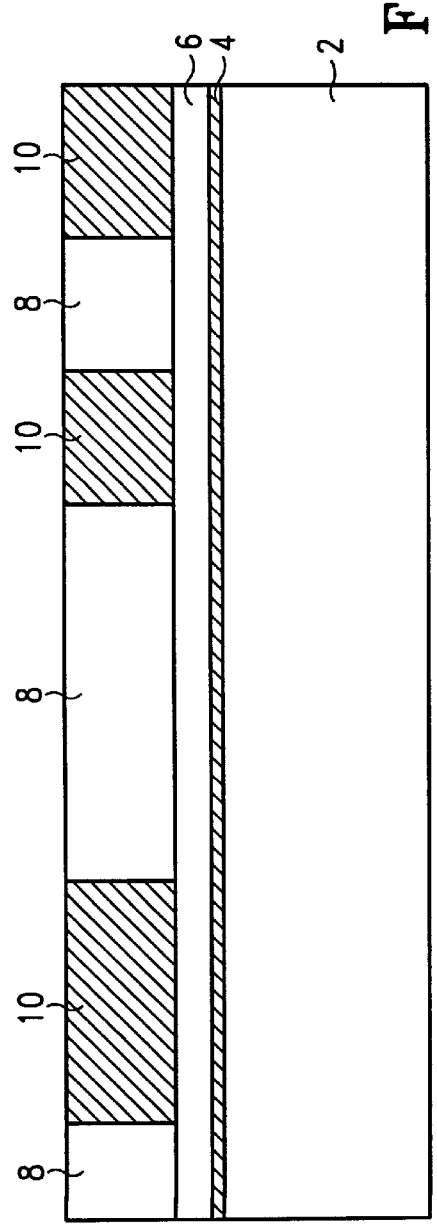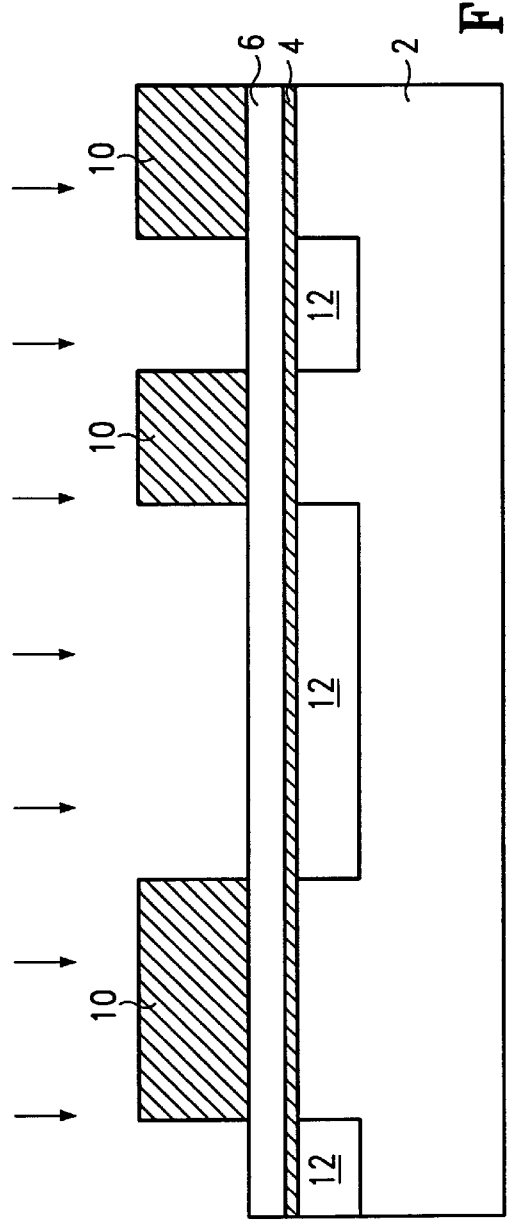

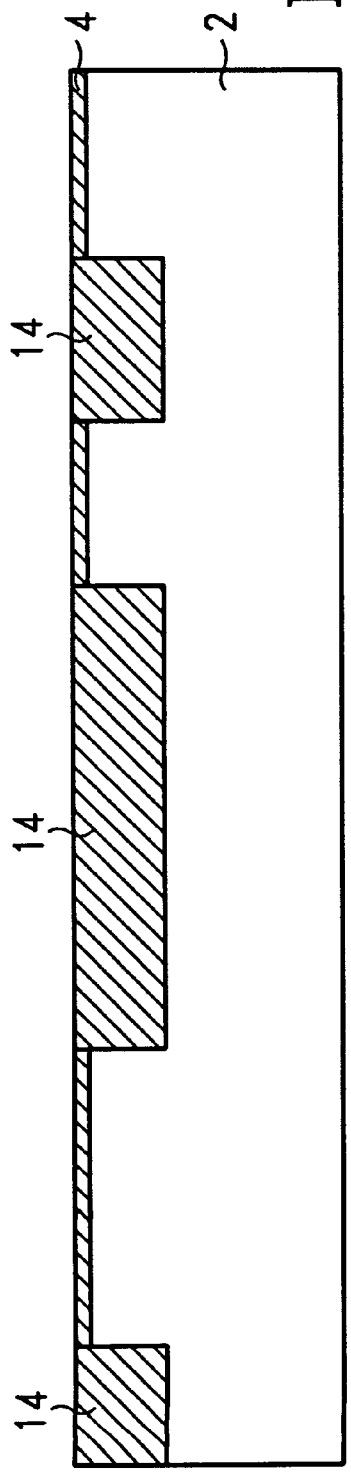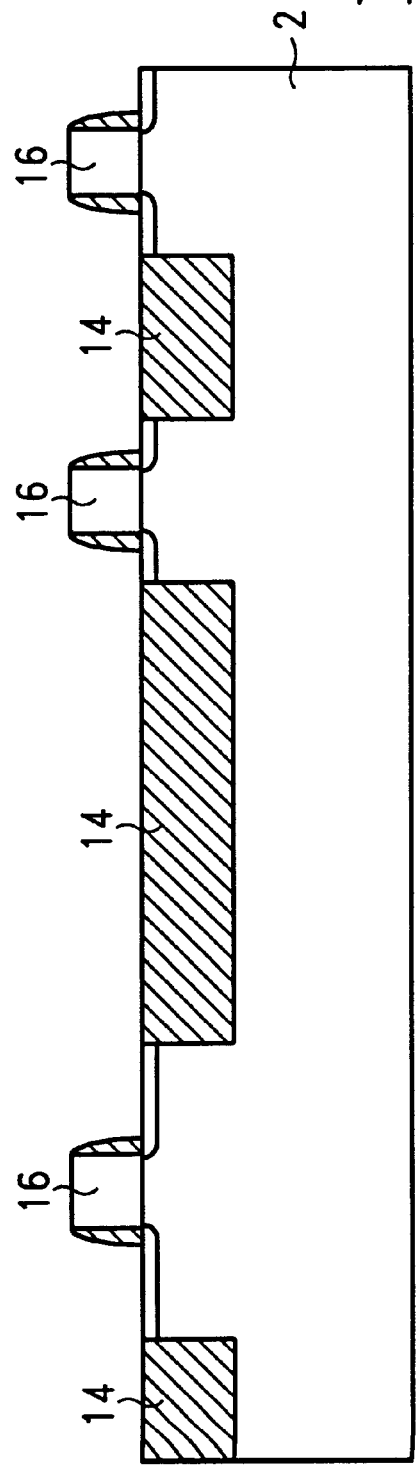

METHOD TO FORM GLOBAL PLANARIZED SHALLOW TRENCH ISOLATION

FIELD OF THE INVENTION

The present invention relates to a method of forming trench isolation, and more specifically, to form a shallow trench isolation for ULSI device application.

BACKGROUND of the INVENTION

Conventional LOCOS isolation process will suffer from bird's beak enroachment and local field oxide thinning effect for deep sub-$\mu$m technology as mentioned in the reference "A. Bryant, et al., in IEDM, p679,1994". By 1980, LOCOS was the standard MOSFET isolation technology. However, the scalability of LOCOS for sub-half-micron CMOS technologies was a question. The issues were the lateral extent of the LOCOS bird's beak, non-planarity, thinning, and the stress-induced silicon defects. Over a decade later, as we prepare for the 0.25 $\mu$m 256 Mb DRAM generation and beyond, the CMOS isolation technology becomes critical. Insulator thinning at narrow dimensions, bird's beak formation, and field-implant encroachment are the key challenge to LOCOS scaling. Insulator thinning contributes to non uniform global planarity and reduced isolation depth. Post etch-back the bird's beak encroachment and field-implant boron encroachment into active regions degrade conduction at MOSFET edges. The result is narrow channel effect (NCE) that increases MOSFET thresholds.

Conventional shallow trench isolation process can solve the above problems, however, the plasma etching induced substrate damages and poor planarization are new issues. These problems has been discussed in references "A. Bryant, et al., in IEDM, p679,1994" and "J. Y. Cheng et al., J. of Electrochem., vol. 144,p.315,1997". As mentioned in the reference "J. Y. Cheng et al., J. of Electrochem., vol. 144,p.315,1997", the LOCOS-based isolation process results in a large encroachment of field oxide (bird's beak) into the devices' active regions, narrow width effect due to high-temperature oxidation, field oxide thinning effect, and nonplanar surface topology. The oxide-filled trench isolation technology is the most promising candidate to circumvent these problems. However, the conventional resist planarization and reactive ion etching (RIE) etchback process has cumulative tolerances associate with large film thickness and easily results in nonplanar surface topography.

SUMMARY OF THE INVENTION

This invention proposes a novel method to form shallow trench isolation for ULSI devices applications. The process is stated briefly as follows.

The pad oxide and nitride films were stacked on Si substrate, followed by defined the active area region. Then, a thick oxide was selectively deposited on nitride by using the liquid phase oxide deposition method (LPD oxide). After stripping the photoresist, a high energy/dose $O_2$ ion implantation was performed through pad oxide/nitride layers into Si substrate. The thick LPD oxide and nitride layers were removed and then a high temperature $N_2/O_2$ annealing process was done to form SIMOX (separation by implanted oxygen) isolation and recover implant-induced damages. Finally, the MOSFETs were fabricated by standard process.

The benefits of the invention are (1) the isolation is bird's beak free;(2) the local field oxide thinning effect can be eliminated; and (3) the global planarization can be easily obtained.

BRIEF DESCRIPTION OF THE DRAWINGS

The foregoing aspects and many of the attendant advantages of this invention will become more readily appreciated as the same becomes better understood by referencing to the following detailed description, when taken in conjunction with the accompanying drawings, wherein:

FIG. 1 is a cross-sectional view of forming a pad oxide and $SiN_x$ layer on Si substrate according to the present invention;

FIG. 2 is a cross-sectional view of defining isolation regions according to the preset invention;

FIG. 3 is a cross-sectional view of growing thick liquid-phase deposition (LPD) oxide with photoresist according to the present invention;

FIG. 4 is a cross-sectional view of performing a high dose/energy $O_2$ implant through pad $SiN_x$/oxide layer to form high-$O_2$ region according to the present invention;

FIG. 5 is a cross-sectional view of removing LPD oxide and pad $SiN_x$ layer and then performing a high temperature $N_2/O_2$ according to the present invention; and FIG. 6 is a cross-sectional view of removing pad oxide and then fabricating MOSFETs according to the present invention.

DETAILED DESCRIPTION OF THE PREFERRED EMBODIMENT

The present invention relates to a method of forming trench isolation, and more specifically, to form a shallow trench isolation for ULSI device application. The detail processes will be described as follows.

Please refer to FIG. 1. In a preferred embodiment, a single crystal silicon substrate 2 with a <100> crystallographic orientation is provided. A pad oxide film 4 is formed on the substrate 2. Typically, the pad oxide film 4 is formed in oxygen ambient at a temperature about 700 to 1100 centigrade degrees. In a preferred embodiment, the thickness of the pad oxide film is approximately 15 to 250 angstroms. Alternatively, the oxide layer 4 may be formed by using any suitable oxide chemical compositions and procedures.

A $SiN_x$ layer (nitride) 6 is subsequently formed on the pad oxide film 4. In a preferred embodiment, the thickness of the $SiN_x$ layer 6 is approximately 300 to 3000 angstroms.

Referring to FIG. 2, photoresist 8 is formed on the $SiN_x$ layer 6 to define isolation regions. Then, a thick oxide 10 is selectively deposited on the nitride layer 6 by using the liquid phase oxide deposition method (LPD oxide) as shown in FIG. 3. As suggested in the reference "T. Homma, et. al., J. of Electrochem., vol. 140, p2410, 1993.", the chemical reactions for the LPD—$SiO_2$ film deposition have been proposed by Nagay et al. as the following formulas (1) and (2)

$$H_2SiF_6 + 2H_2O \rightarrow 6HF + SiO_2\downarrow \quad (1)$$

$$H_3BO_3 + 4HF \rightarrow BF_4^- + H_3O^- + 2H_2O \quad (2)$$

First, hydrofluoric acid (HF) is separated from hydrofluosilicie acid by $SiO_2$ generation as shown in formula (1). Then the hydrofluoric acid is consumed by the boric acid and forms boron tetrafluoride ions ($BF_4^{31}$ ) as shown in the formula (2). Accordingly, the chemical equilibrium of formula (1) shifts to the right. The LPD-$SiO_2$ film deposition occurs by these continual reactions. Besides, the liquid phased deposition oxide film has the properties that it will not grown on the photoresist 8. So we can selectively deposited and adjust its thickness to satisfy the demands of our process.

Referring next to FIG. 4, after the LPD oxide layer 10 is formed, we strip the photoresist layer 8. After stripping the photoresist layer 8, a high energy/dose $O_2$ ion implantation is performed through the pad nitride 6 and oxide layer 4 into silicon substrate 2 to form high-$O_2$ region 12. In a preferred embodiment, the dosage of the $O_2$ ion implantation is about $5*10^{16}$ to $10^{19}$. ions/cm$^2$, the energy is about 100 to 500 KeV.

Referring to FIG. 5, after the high dose/energy $O_2$ ion implantation is done, the nitride layer 6 and the thick oxide layer(i.e. LPD oxide layer) 10 are removed. In a preferred embodiment, the LPD oxide 10 is removed by BOE(Buffer Oxide Etcher) or diluted HF solution, the pad nitride layer 6 is removed by hot $H_3PO_4$ solution. Then, a high temperature $N_2/O_2$ annealing process is performed to form SIMOX (separation by implanted oxygen) isolation 14 by converting the high-$O_2$ region 12 into SIMOX and recover the implant-induced damage as suggest in "S. M. Sze, VLSI Technology, Ch. 8, p.366, 1988.". The high temperature $N_2/O_2$ annealing can also be replaced by $N_2$, $O_2$ or $N_2O$ annealing. In a preferred embodiment, the high temperature annealing is performed at the temperature of 1050 to 1350° C. for 30 to 400 minutes.

Referring to FIG. 6, the pad oxide layer 4 is removed. In a preferred embodiment, the pad oxide layer can be removed by diluted HF solution. Finally, the MOSFETs 16 are fabricated on the active regions between the SIMOX isolations 14 by standard process.

The benefits of the invention are (1) the isolation is bird's beak free;(2) the local field oxide thinning effect can be eliminated; and (3) the global planarization can be easily obtained.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming shallow trench isolation in semiconductor substrate, said method comprising the step of:

forming an oxide layer on said substrate;

forming a nitride layer on said oxide layer;

forming a photoresist layer on said nitride layer to define isolation regions that uncovered by said photoresist layer;

forming a liquid phase deposition oxide on said isolation regions;

removing said photoresist layer;

performing an oxygen ion implantation through said oxide layer and said nitride layer into said substrate by using said liquid phase deposition oxide layer as implant mask to form relative high oxygen ion contained region in said substrate;

removing said liquid phase deposition oxide layer; and performing an annealing process to form isolation regions in said substrate and recover implant-induced damage.

2. The method of claim 1, wherein said liquid phase deposition oxide is removed by diluted HF solution.

3. The method of claim 1, wherein said liquid phase deposition oxide being removed by buffer oxide etcher.

4. The method of claim 1, wherein said oxygen ion implantation have implantation dosage about $5*10^{16}$ to $10^{19}$ ions/cm$^2$.

5. The method of claim 1, wherein said oxygen ion implantation have implantation energy about 100 to 500 KeV.

6. The method of claim 1, wherein said isolation regions being formed by converting said relative high oxygen ion contained regions into SIMOX isolation regions during said annealing process.

7. The method of claim 6, wherein said annealing process being performed in $N_2/O_2$ ambient at the temperature of 1050 to 1350 centigrade degrees for 30 to 400 minutes.

8. The method of claim 6, wherein said annealing process being performed in $N_2O$ ambient at the temperature of 1050 to 1350 centigrade degrees for 30 to 400 minutes.

9. The method of claim 6, wherein said annealing process being performed in $N_2$ ambient at the temperature of 1050 to 1350 centigrade degrees for 30 to 400 minutes.

10. The method of claim 6, wherein said annealing process being performed in $O_2$ ambient at the temperature of 1050 to 1350 centigrade degrees for 30 to 400 minutes.

* * * * *